(12) United States Patent
Pham et al.

(10) Patent No.: US 12,066,492 B2
(45) Date of Patent: Aug. 20, 2024

(54) BATTERY AND ALTERNATOR SIMULATOR

(71) Applicant: INNOVA ELECTRONICS CORPORATION, Irvine, CA (US)

(72) Inventors: Phuong Pham, Fountain Valley, CA (US); Ly Bach, Ho Chi Minh (VN); Tri Tran, Ho Chi Minh (VN)

(73) Assignee: Innova Electronics Corporation, Irvine, CA (US)

( * ) Notice: Subject to any disclaimer, the term of this patent is extended or adjusted under 35 U.S.C. 154(b) by 181 days.

(21) Appl. No.: 17/697,495

(22) Filed: Mar. 17, 2022

(65) Prior Publication Data

US 2023/0296677 A1    Sep. 21, 2023

(51) Int. Cl.
*G01R 31/36* (2020.01)
*G01R 31/367* (2019.01)

(52) U.S. Cl.
CPC ....... *G01R 31/3646* (2019.01); *G01R 31/367* (2019.01)

(58) Field of Classification Search
None
See application file for complete search history.

(56) References Cited

U.S. PATENT DOCUMENTS

| | | |
|---|---|---|
| 7,774,151 B2 | 8/2010 | Bertness |
| 8,013,611 B2 | 9/2011 | Elder et al. |
| 8,473,114 B2 | 6/2013 | Bauerle et al. |
| 8,958,998 B2 | 2/2015 | Bertness |
| 9,135,760 B2 | 9/2015 | Yuasa et al. |
| 9,483,884 B2 | 11/2016 | Chen et al. |
| 9,761,066 B2 | 9/2017 | Chen et al. |
| 9,776,293 B2 | 10/2017 | Nakako et al. |
| 10,328,807 B2 | 6/2019 | Eriksson et al. |
| 10,830,824 B2 | 11/2020 | Andersson |
| 10,870,360 B2 | 12/2020 | Campbell et al. |
| 10,894,482 B2 | 1/2021 | Follen et al. |
| 10,921,381 B2 | 2/2021 | Karner et al. |
| 10,962,599 B2 | 3/2021 | Petrucelli |
| 11,644,513 B1 * | 5/2023 | Ding .................. H02J 7/005 324/430 |

(Continued)

FOREIGN PATENT DOCUMENTS

EP    3211606 A2    8/2017

*Primary Examiner* — Jas A Sanghera
(74) *Attorney, Agent, or Firm* — Stetina Brunda Garred & Brucker

(57) ABSTRACT

A battery and alternator simulator for use in testing operational capability of a battery tester includes a user interface configured to receive a user input signal associated with a desired testing condition. The simulator additionally includes a signal database includes a plurality of testing conditions and a plurality of testing signals stored thereon, each testing condition being matched with one of the plurality of testing signals. A processor is in communication with the user interface and the signal database, with the processor being configured to identify one of the testing signals based on the testing condition associated with the received user input signal. A pair of testing terminals is in operative communication with the processor and is configured to be electrically connectable to a corresponding pair of terminals on the battery tester for communicating the testing signal to the battery tester.

18 Claims, 6 Drawing Sheets

(56) References Cited

U.S. PATENT DOCUMENTS

| | | | |
|---|---|---|---|
| 2004/0104728 A1* | 6/2004 | Bertness | G01R 31/007 |
| | | | 324/426 |
| 2006/0220809 A1 | 10/2006 | Stigall et al. | |
| 2006/0273800 A1* | 12/2006 | Horning | G01R 31/2848 |
| | | | 324/426 |
| 2013/0275783 A1* | 10/2013 | Liu | G06F 11/00 |
| | | | 307/66 |
| 2017/0285113 A1 | 10/2017 | Hsiao et al. | |
| 2018/0372801 A1 | 12/2018 | Duhaut et al. | |
| 2019/0324088 A1 | 10/2019 | Andersson | |
| 2020/0064408 A1 | 2/2020 | Sato | |
| 2022/0057454 A1* | 2/2022 | Kunisch | G01R 31/2848 |

* cited by examiner

BATTERY AND ALTERNATOR SIMULATOR

CROSS-REFERENCE TO RELATED APPLICATIONS

Not Applicable

STATEMENT RE: FEDERALLY SPONSORED RESEARCH/DEVELOPMENT

Not Applicable

BACKGROUND

1. Technical Field

The present disclosure relates generally to an automotive diagnostic tool, and more specifically, to a device configured to generate an electrical output signal which mimics that of a vehicle battery or alternator for use on a battery or alternator tester to ensure proper operation of the battery or alternator tester.

2. Description of the Related Art

Vehicles typically include at least one battery to provide power when starting the engine of the vehicle, as well as to power electrical equipment on the vehicle during use of the vehicle. As such, the battery may be critical to operation of the vehicle. If the battery has failed, oftentimes, the vehicle will not start or function properly. When fully charged, a battery may measure at 12.6 volts or greater. When the engine is running, the battery may measure between 13.7-14.7 volts.

Accordingly, many battery testers have been developed to allow for testing of the vehicle battery to try and detect a battery that may be nearing a failure so as to replace the battery before failure occurs. A conventional battery tester may include a main unit having a digital display, as well as hardware and software needed to implement the functionalities of the battery tester. A pair of leads may be connected to the main unit and may be configured to be attached to respective terminals on the battery. Battery testing may be conducted with the engine off to determine the battery voltage prior to starting the vehicle. Battery testing may also include testing the battery when a vehicle is started. During the process of starting a vehicle, the voltage associate with the battery may be similar to the waveform depicted in FIG. 1. As can be seen in the waveform, there is a constant voltage of 12.07 volts at the beginning of the reading (e.g., the generally straight horizontal segment extending from the vertical axis). The shape of the waveform then drops, and then proceeds to increase until the voltage levels off.

In many vehicle battery tests, there are two parameters that are given primary consideration, namely, the drop voltage and the cranking voltage. The drop voltage is the lowest voltage recorded, while the cranking voltage refers to the average voltage during the increase from the drop voltage to the leveled off voltage. When the vehicle is cranking, the battery voltage may decrease while providing required current to a starter motor, along with powering an ignition system and fuel injectors. In the example provided in FIG. 1, the drop voltage is 9.25V and the cranking voltage is 10.72V.

The results of any battery test using a conventional battery or alternator tester rely on the proper functioning of the battery or alternator tester. In other words, if the battery or alternator tester is operating improperly, the results of the test are likely to be inaccurate.

Therefore, there is a need in the art for a device which configured to allow for testing of the operational accuracy of a battery or alternator tester. Various aspects of the present disclosure address this particular need, as will be discussed in more detail below.

BRIEF SUMMARY

In accordance with one embodiment of the present disclosure, there is provided a battery and alternator simulator for use in testing operational capability of a battery tester. The simulator includes a user interface configured to receive a user input signal associated with a desired testing condition. The simulator additionally includes a signal database includes a plurality of testing conditions and a plurality of testing signals stored thereon, each testing condition being matched with one of the plurality of testing signals. A processor is in communication with the user interface and the signal database, with the processor being configured to identify one of the testing signals based on the testing condition associated with the received user input signal. A pair of testing terminals is in operative communication with the processor and is configured to be electrically connectable to a corresponding pair of terminals on the battery tester for communicating the testing signal to the battery tester.

The user interface may include a cranking voltage input circuit configured to receive at least a portion of the user input signal corresponding to a desired cranking status. The user interface may include a drop voltage input circuit configured to receive at least a portion of the user input signal corresponding to a desired drop voltage.

The plurality of testing conditions in the signal database may include a good crank voltage, a warning crank voltage, and a bad crank voltage. The plurality of testing conditions in the signal database may include a good voltage drop, a warning voltage drop, and a bad voltage drop.

The processor may be further configured to detect a battery tester load in response to the pair of testing terminals being electrically connected to the corresponding pair of terminals on the battery tester, and generate a warning signal when the detected battery tester load is above a predetermined magnitude.

The simulator may additionally include a start circuit in communication with the processor. The start circuit may be configured to receive a start signal from the user, with the processor being configured to facilitate transmission of the testing signal via the pair of testing terminals in response to receipt of the start signal.

The simulator may additionally include a display in communication with the processor for displaying information associated with the testing signal.

According to another embodiment, there is provided a method of testing an operational capability of a battery tester. The method includes receiving a user input signal associated with a desired testing condition. The method additionally includes identifying, using a processor, one of a plurality of testing signals stored on a signal database based on the received user input signal, with each testing condition stored on the signal database being matched with one of the plurality of testing signals.

The testing signal is communicated to the battery tester via a pair of testing terminals in operative communication with the processor and configured to be electrically connectable to a corresponding pair of terminals on the battery tester.

The step of receiving the user input signal may include receiving a desired cranking status at a cranking voltage input circuit.

The step of receiving the user input signal may include receiving a desired drop voltage at a drop voltage input circuit.

The method may additionally include detecting a battery tester load in response to the pair of testing terminals being electrically connected to the corresponding pair of terminals on the battery tester. A warning signal may be generated when the detected battery tester load is above a predetermined magnitude.

The method may additionally comprise receiving a start signal from the user at a start circuit in communication with the processor, with the processor being configured to facilitate transmission of the testing signal via the pair of testing terminals in response to receipt of the start signal.

The method may also include displaying information associated with the testing signal on a display in communication with the processor.

The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

The detailed description set forth below in connection with the appended drawings is intended as a description of certain embodiments of a vehicle battery and/or alternator simulator and is not intended to represent the only forms that may be developed or utilized. The description sets forth the various structure and/or functions in connection with the illustrated embodiments, but it is to be understood, however, that the same or equivalent structure and/or functions may be accomplished by different embodiments that are also intended to be encompassed within the scope of the present disclosure. It is further understood that the use of relational terms such as first and second, and the like are used solely to distinguish one entity from another without necessarily requiring or implying any actual such relationship or order between such entities.

Various aspects of the present disclosure relate to a simulator device and related methodology for testing the operability of a vehicle battery and alternator tester (hereinafter "battery tester" or "battery tools"). The simulator is capable of generating various testing signals to simulate voltage of a vehicle battery during various operational stages of the vehicle battery, as well as various health conditions of the vehicle battery. The various operational stages may include operation of the battery in both a cranking mode as well as a drop voltage mode. The various health conditions of a vehicle battery may be good, warning, or bad, with each health condition being associated with a particular voltage or signal waveform commonly associated with those health conditions. Thus, use of the simulator on a battery tester may imitate various health conditions of a vehicle battery or alternator to ensure that the battery tester is operating properly.

Figure 1:
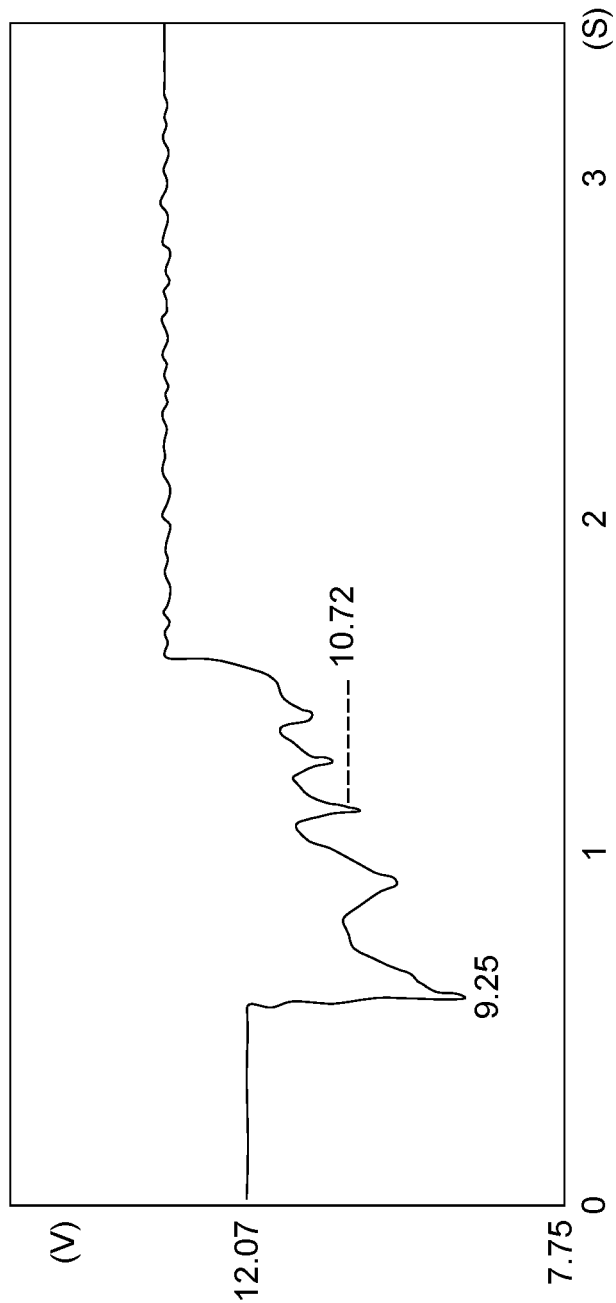
FIG. 1 is an exemplary depiction of a waveform representative of a voltage associated with a vehicle battery, while the vehicle is at rest, during starting of the vehicle, and idling of the vehicle.
Figure 2:
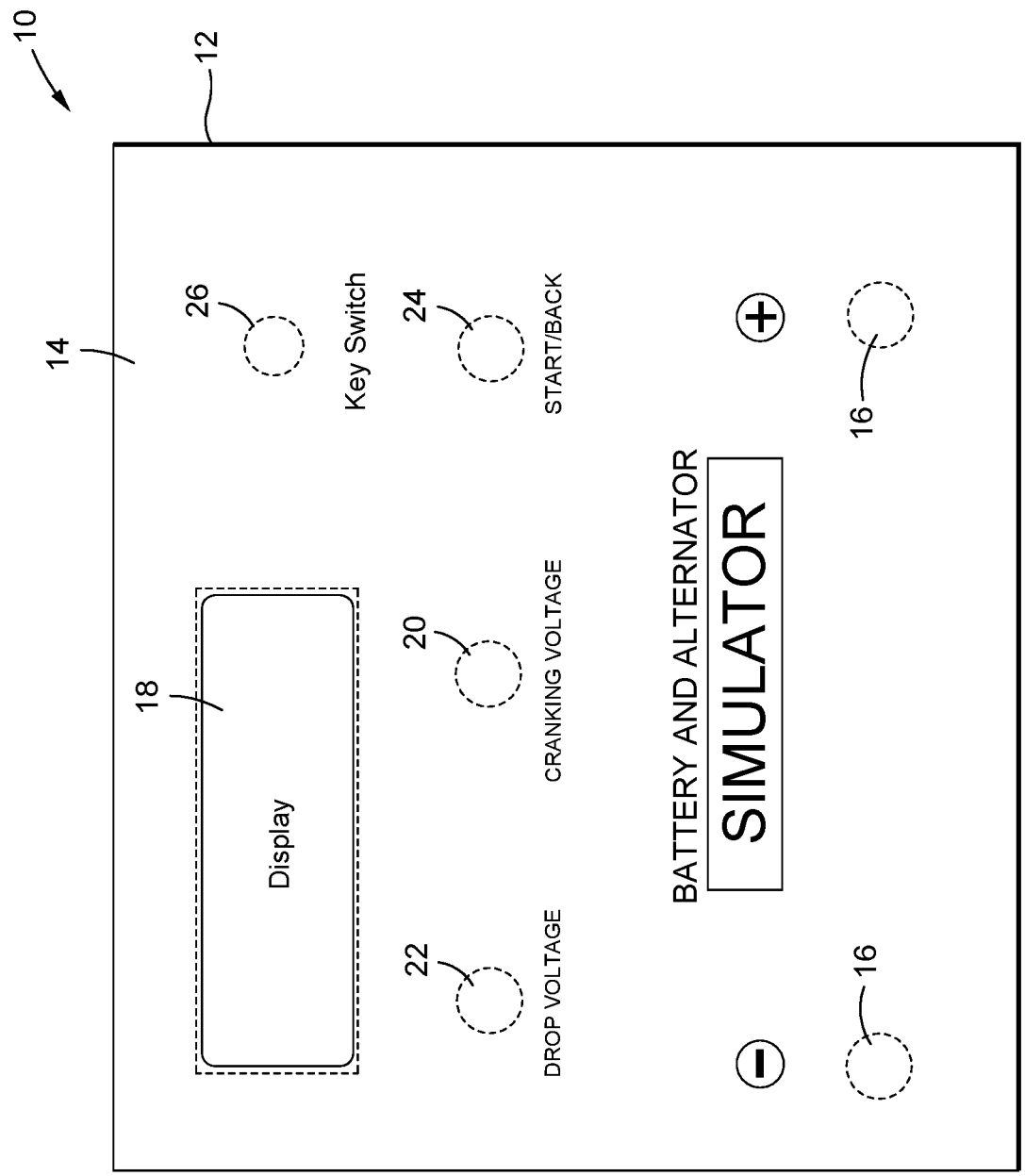
FIG. 2 is a schematic view of a battery and alternator simulator.
Figure 3:
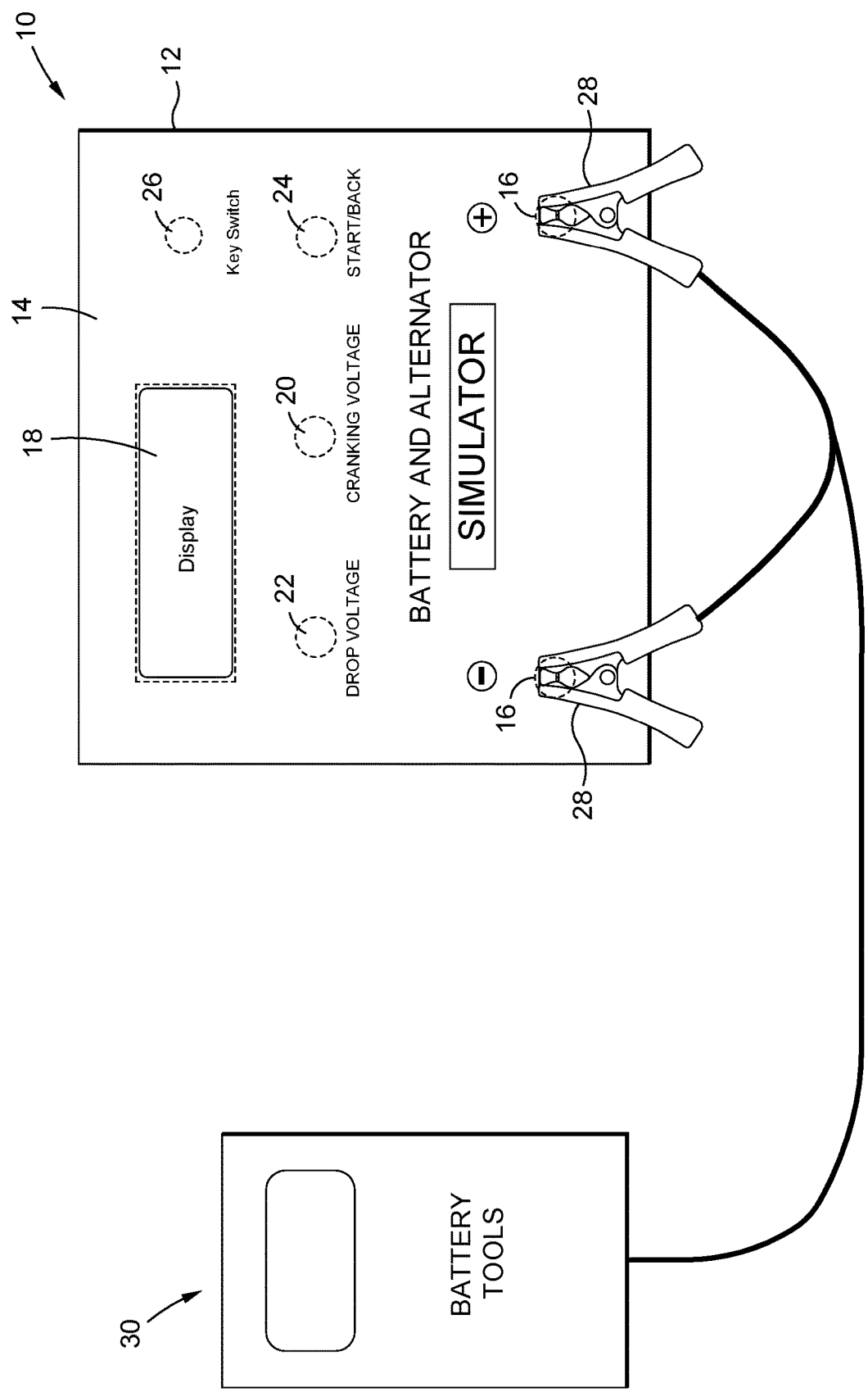
FIG. 3 is a schematic view of a battery tester connected to the battery and alternator simulator.

Referring now specifically to FIG. 2, there is depicted on embodiment of a simulator 10 which includes a main housing 12 having a main panel 14, into which may be integrated a user interface, as well as a pair of testing terminals 16. The user interface may refer to those features on the simulator 10 adapted to facilitate communication of data and information to a user, as well as those features adapted to facilitate receipt of data and information from the user. The user interface may include a display 18, and a plurality of switches, knobs, dials, and/or buttons. As discussed in more detail below, the user interface may include a cranking voltage input 20 (e.g., a cranking voltage input circuit), a drop voltage input 22 (e.g., a drop voltage input circuit), a start/back input 24 (e.g., a start circuit) and a key switch 26. The simulator 10 may additionally include a pair of testing terminals 16 (e.g., a positive terminal and a negative terminal) configured to be engageable with a battery tester for communicating a testing signal to the battery tester. As shown in FIG. 3, the testing terminals 16 may be configured to be electrically connectable to a corresponding pair of terminals (e.g., clamps) 28 on the battery tester 30 for communicating the testing signal to the battery tester 30.

Figure 4:
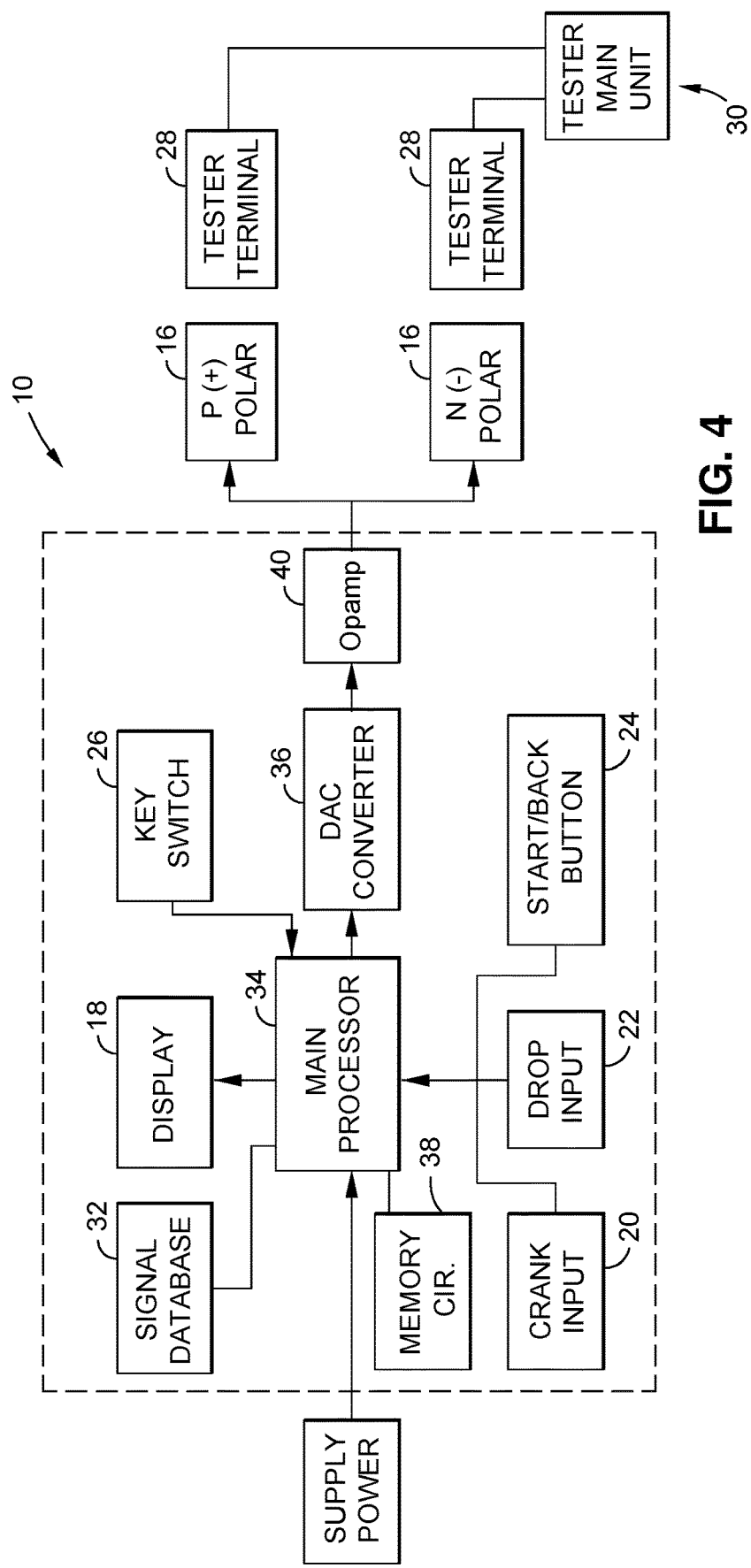
FIG. 4 is an electrical schematic of the battery and alternator simulator along with the battery tester.

Referring now to FIG. 4, there is depicted an electrical schematic of the simulator 10, which shows a main processor 34 in communication with a signal database 32, a display 18, the key switch 26, a digital-to-analog (DAC) converter 36, a memory circuit 38, the crank voltage input 20, the drop voltage input 22, the start/stop input 24, and the key switch 26. An operational amplifier 40 may be in communication with the DAC converter 36, as will be explained in more detail below.

Figure 5:
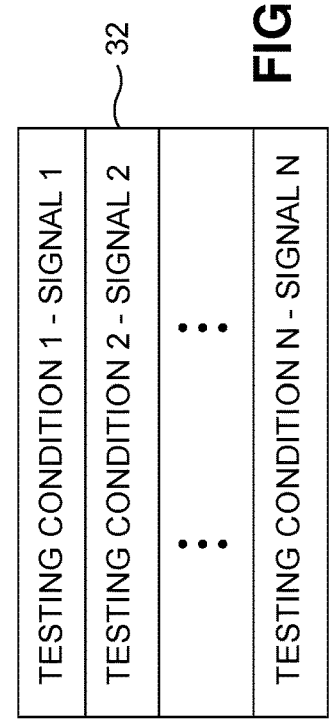
FIG. 5 is a schematic view of signal database having a plurality of testing conditions matched with respective output signals.

The signal database 32 may include a plurality of testing conditions and a plurality of testing signals stored thereon, with each testing condition being matched with one of a plurality of testing signals, as shown in FIG. 5. As such, the signal database 32 may allow a user to select a particular testing condition (e.g., a testing condition associated with a healthy battery or an unhealthy battery), and the voltage associated with each testing condition may be generated by the simulator 10.

Each testing condition may be associated with a respective testing signal, which may include a signal at a particular voltage or a signal having a particular voltage waveform. The plurality of testing conditions in the signal database may relate to the crank voltage, as well as the drop voltage. Therefore, the testing conditions may include a good crank voltage, a warning crank voltage, and a bad crank voltage, as well as a good voltage drop, a warning voltage drop, and a bad voltage drop. In one embodiment, a good crank voltage may be greater than 10V, a warning crank voltage may be in a range that is greater than 9.5V to 10V, and a bad crank voltage may be less than or equal to 9.5V. A good voltage drop may be greater than 7.2V, a warning voltage drop may be between 6.5V and 7.2V, and a bad voltage drop may be less than 6.5V. It is understood that the foregoing values are associated with one particular implementation, and thus, the scope of the present disclosure is not limited thereto.

The testing signal generated by the simulator may be a waveform based on output voltages over a period of time. The crank voltage and the voltage drop may be characteristics of a given waveform, and thus, if a user provides a crank voltage value and a drop voltage value, a waveform based on those provided values may be modeled according to predetermined rules or algorithms. As an alternative, the system may include stored examples of different waveforms associated with a good status, a warning status, or a bad status.

The processor 34 is in communication with the user interface and the signal database 32, with the processor 34 being capable of facilitating the functionalities described herein based on user input received from the user interface. For instance, when a user provides user input, such as a desire to generate a warning crank voltage signal, the processor 34 may be configured to access the signal database 32 and identify the testing signal associated with the warning crank voltage signal. Once the testing signal is identified, the processor 34 may be capable of facilitating generation and transmission of the testing signal via the testing terminals. Accordingly, the pair of testing terminals 16 may be in operative communication with the processor 34. The testing terminals 16 may also be configured to be electrically connectable to a corresponding pair of terminals 28 on the battery tester 30 for communicating the testing signal to the battery tester 30. In one embodiment, each testing terminal may include a stud or protrusion which may be connected to a clamp-style terminals on the battery tester 30. However, the configuration of the terminals may vary without departing from the spirit and scope of the present disclosure.

The user interface may include a cranking voltage input circuit (e.g., the crank input 20) configured to receive a portion of the user input signal corresponding to a desired cranking status, e.g., good cranking status, warning cranking status, or bad cranking status. A drop voltage input circuit (e.g., the drop input 22) may be included on the user interface and may be configured to receive a portion of the user input signal corresponding to a desired drop voltage status, e.g., good drop status, warning drop status, or bad drop status. In one embodiment, the user may simply select identifiers, such as "good", "warning" or "bad", when selecting the crank voltage and the drop voltage, with each identifier being associated with a pre-programmed voltage. Alternatively, the user may enter a numerical value for each voltage.

In the exemplary embodiment, the crank voltage input 20 and drop voltage input 22 are shown as separate dials/knobs, with each knob or dial may be a potentiometer configured to facilitate selection of a desired voltage by a user. The key switch 26 may be a separate potentiometer knob configured to allow for user control of a desired voltage, particularly when used in an alternator testing mode. It is contemplated that to the extent the simulator allows for user adjustment of any voltage, whether it be crank voltage, drop voltage, or voltage during alternator testing, the controls associated therewith may be integrated into separate dials/knobs, or a single dial/knob capable of facilitating user input of separate voltage signals.

The start/back button 24 is in communication with the processor 34 and is configured to facilitate user navigation of user options and related operation of the tester. The start/back button may be configured to be manipulated in two different modes, with a first mode being associated with a start signal, and a second mode being associated with a back signal. For instance, the start signal may be associated with rotation of the start/back button in a first rotational direction, while the back signal may be associated with rotation of the start/back button a second rotational direction. It is also contemplated that the start/back button may be rotatable and depressible, such that rotation of the start/back button may be associated with the start signal or the back signal, and depressing of the start/back button may be associated with the other of the start signal or the back signal.

According to one embodiment, the simulator 10 may be configured to detect if the battery tester 30 to which the simulator 10 may be operatively connected may be associated with too heavy of a load for the simulator 10, which if left connected, may cause damage to the simulator 10. In particular, the processor 34 may be configured to detect a battery tester load in response to the pair of testing terminals 16 being electrically connected to the corresponding pair of terminals 28 on the battery tester 30. The detected battery tester load may be compared to a predetermined magnitude, which may be stored in a memory circuit 38 located on the simulator 10. The processor 34 may generate a warning signal when the detected battery tester load is above the predetermined magnitude. The warning signal may be depicted on the display 18 (e.g., "OVERLOAD") and/or emitted as an audible signal. In this regard, the simulator 10 may include a speaker to facilitate transmission of an audible signal.

The display 18 may be in communication with the processor 34 for displaying information associated with the testing signal. The display 18 may depict voltage values and the corresponding waveform for different simulations that may be performed by the simulator 10. Other data and information associated with operation of the simulator 10 may also be depicted on the display 18.

Figure 6:
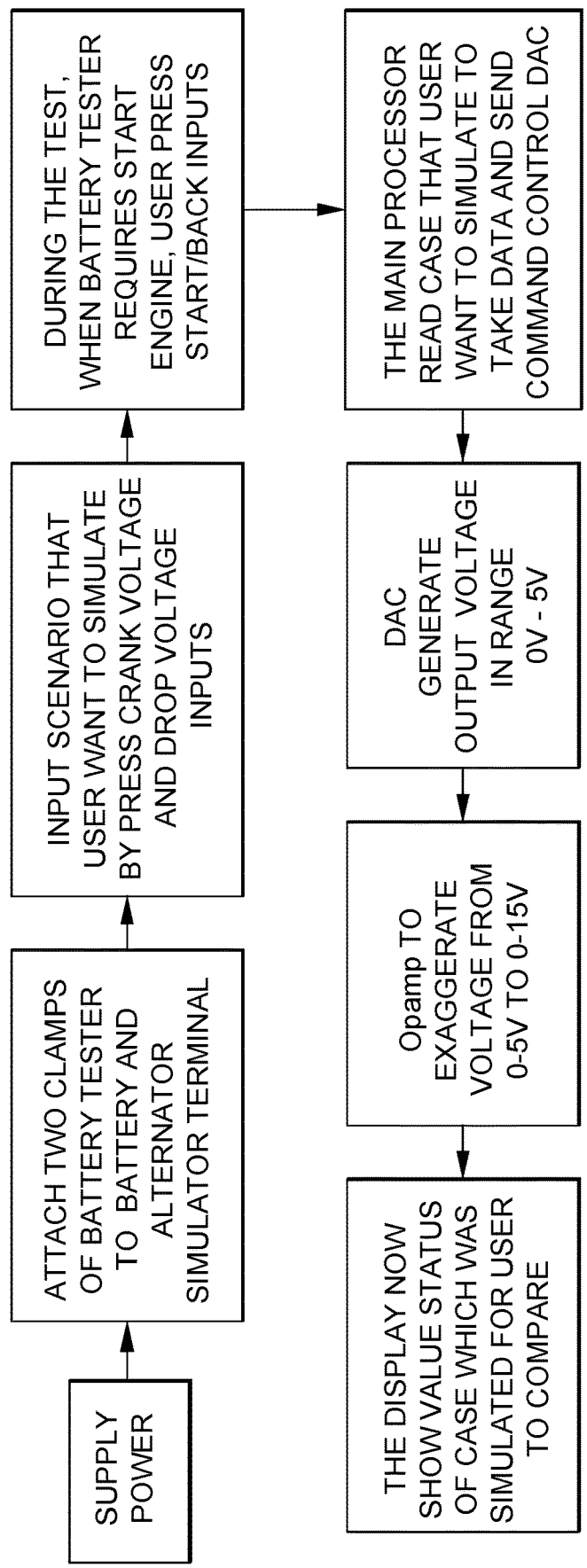
FIG. 6 is a flow chart of a process of using the battery and alternator simulator in connection with the battery testing tool.

The simulator 10 may be used in at least two different operational modes: a battery simulating mode and an alternator simulating mode. FIG. 6 is a flow chart associated with operation of the simulator 10 in the battery simulating mode, with the operation including supplying power to the simulator 10, either via plug connectable to an outlet or via an onboard battery, and attaching the clamps 28 of the battery tester 30 to the terminals on the simulator 10. A user then enters the desired crank voltage value and drop voltage value (e.g., the user input signal) associated with a desired testing condition. The desired crank voltage value may be entered based on a desired testing condition, or as a numerical value. When the desired testing condition is entered, the processor 34 may identify the testing signal stored on a signal database 32 associated with the desired testing.

During the test, when the battery tester 30 requires a start engine simulation, a user may actuate the start/back input 24 to initiate the test. When the start/back input 24 is actuated, a signal may be sent to the processor 34, and the processor 34 may be configured to read the testing condition desired by the user, e.g., the testing condition associated with the user input signal. Upon reading the desired testing situation, the main processor 34 may generate and communicate the testing signal associated with the desired testing condition. The generation of the testing signal may entail the main processor 34 sending a command value to the digital-to-analogue converter 36, which may be an MCP4725 chip using communication protocol I2C. The value may be in the range of 0-4095 (12 bit). The wider the range, the more detail a given digital-to-analogue converter can adjust to. As an example, if a given digital-to-analogue converter generates a 0-5V output, and the associated range of the digital-to-analogue converter is 0-4095, then the minimum voltage change that can be accommodated by that converter is approximately 0.0012V (e.g., 5V/4095). Other ranges may be used with a prescribed output voltage range in a corresponding manner. The real waveform voltage may be up to 15V, and thus, an operational amplifier (e.g., an Opamp) 40 may be used to amplify or exaggerate the 0-5V signal to 0-15V signal and deliver it via the pair of terminals (e.g., a polar signal). The MCP4725 chip is an exemplary digital-to-analog converter manufactured by MICROCHIP TECHNOLOGY, although other digital-to-analog converters manufactured by other entities may also be used without departing from the spirit and scope of the present disclosure.

The testing signal may be communicated to the battery tester 30 via the pair of testing terminals 16, onto which the clamps 28 of the battery tester 30 having connected. The display 18 may depict the voltages or other values associated with the desired testing condition, to allow a user to compare with what is being detected by the battery tester 30. For instance, the display 18 may depict the value of the cranking voltage and drop voltage with the desired output waveform. The user may check the detected signal on the battery tester 30 and the detected signal should match what is displayed on the simulator 10. When there is a match, that may be an indication that the battery tester 30 is working properly. If there is not a match, that may be an indication that the battery tester 30 is not working properly.

The method may additionally include detecting a battery tester load in response to the pair of testing terminals 16 being electrically connected to the corresponding pair of terminals 28 on the battery tester 30. A warning signal may be generated when the detected battery tester load is above a predetermined magnitude.

Figure 7:
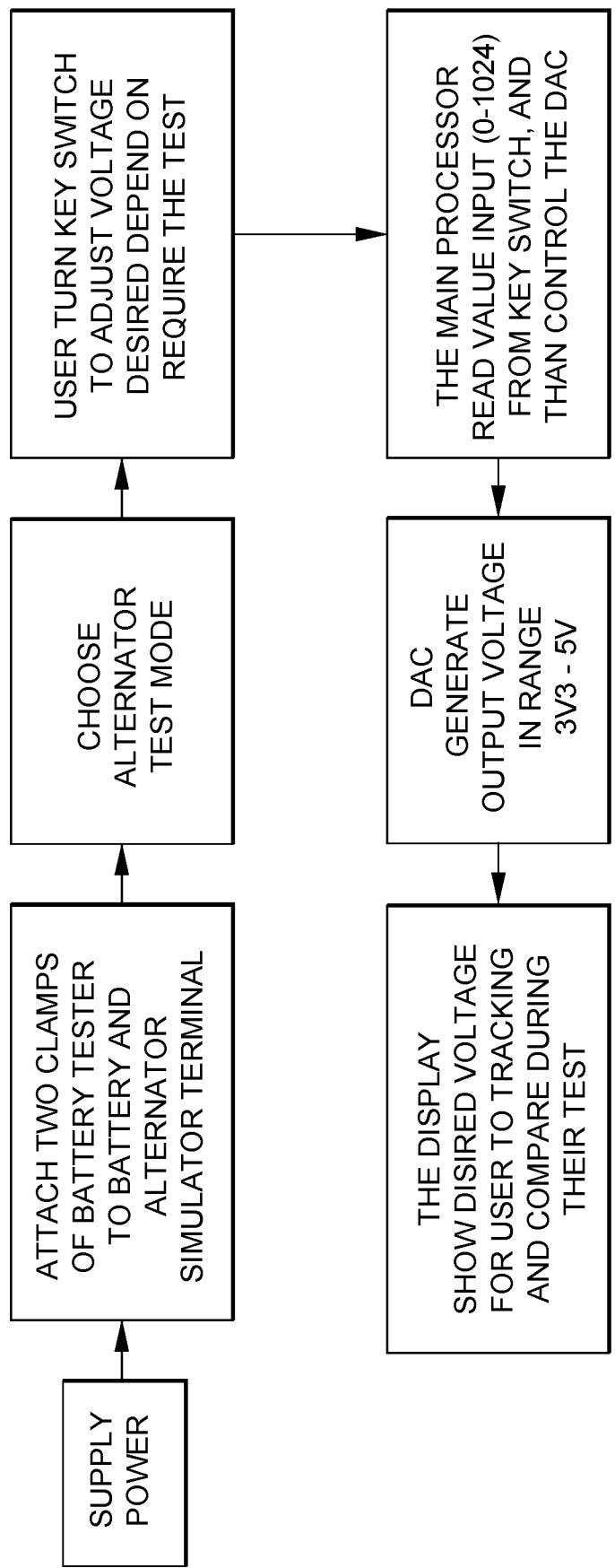
FIG. 7 is a flow chart representative of a process of using the battery and alternator simulator in an alternator test mode.

Referring now to FIG. 7, there is depicted an exemplary flowchart associated with using the simulator 10 to test an alternator. The process entails supplying power and attaching the clamps 28 on the battery tester 30 to the terminals 16 on the simulator 10. The user then selects an alternator test mode on the simulator 10. The voltage inputs may be turned to adjust the desired voltage, which may be dependent on the test generated by the simulator 10. The processor 34 may read a value input from the voltage inputs and then control an output from the digital-to-analogue converter 36. The output may be amplified by the Opamp 40, as desired. The signal from the simulator 10 may be depicted on the display 18 for comparison with what is detected and displayed on the battery tester 30.

In both the battery mode and the alternator mode, an output voltage may be changed to perform the associated test. For the battery mode, there is a focus on simulating the starting of the engine, e.g., a cranking event, which typically includes a waveform pattern and is associated with a certain period of time. Conversely, in the alternator mode, the output voltage may not drop, may not glitch, and may stay at approximately the same level continuously. Accordingly, in the alternator mode, a user may adjust the output voltage level as desired to create their desired test case.

The particulars shown herein are by way of example only for purposes of illustrative discussion, and are not presented in the cause of providing what is believed to be most useful and readily understood description of the principles and conceptual aspects of the various embodiments of the present disclosure. In this regard, no attempt is made to show any more detail than is necessary for a fundamental understanding of the different features of the various embodiments, the description taken with the drawings making apparent to those skilled in the art how these may be implemented in practice.

What is claimed is:

1. A battery and alternator simulator for use in testing operational capability of a battery tester, the simulator comprising:
   a user interface configured to receive a user input signal corresponding to a desired battery health testing condition;
   a signal database having a plurality of battery health testing conditions and a plurality of testing signal characteristics stored thereon, each battery health testing condition being associated with at least one of the plurality of testing signal characteristics;
   a processor in communication with the user interface and the signal database, the processor being configured to:
      identify the at least one of the testing signal characteristics associated with the battery health testing condition corresponding to the received user input signal;
      facilitate generation of an electrical testing signal having the at least one of the testing signal characteristics having been identified; and
   a pair of testing terminals in operative communication with the processor and configured to be electrically connectable to a corresponding pair of terminals on the battery tester for communicating the generated testing signal to the battery tester.

2. The simulator of claim 1, wherein the user interface includes a cranking voltage input circuit configured to receive at least a portion of the user input signal corresponding to a desired cranking status, the testing signal being generated to conform to the desired cranking status.

3. The simulator of claim 1, wherein the user interface includes a drop voltage input circuit configured to receive at least a portion of the user input signal corresponding to a desired drop voltage, the testing signal being generated to conform to the desired drop voltage.

4. The simulator of claim 1, wherein the plurality of battery health testing conditions in the signal database includes a good crank voltage, a warning crank voltage, and a bad crank voltage.

5. The simulator of claim 1, wherein the plurality of battery health testing conditions in the signal database includes a good voltage drop, a warning voltage drop, and a bad voltage drop.

6. The simulator of claim 1, wherein the processor is further configured to:
   detect a battery tester load in response to the pair of testing terminals being electrically connected to the corresponding pair of terminals on the battery tester; and
   generate a warning signal when the detected battery tester load is above a predetermined magnitude.

7. The simulator of claim 1, further comprising a start circuit in communication with the processor, the start circuit being configured to receive a start signal from the user, the processor being configured to facilitate generation of the testing signal via the pair of testing terminals in response to receipt of the start signal.

8. The simulator of claim 1, further comprising a display in communication with the processor for displaying information associated with the testing signal.

9. A method of testing an operational capability of a battery tester, the method comprising:
receiving, at a processor in a signal simulating device, a user input signal corresponding to a desired battery health testing condition;
identifying, using the processor, at least one of a plurality of testing signal characteristics stored on a signal database, each battery health testing condition stored on the signal database being associated with at least one of the plurality of testing signal characteristics;
generating an electrical testing signal having the at least one of the testing signal characteristics having been identified; and
communicating the generated testing signal to the battery tester via a pair of testing terminals in operative communication with the processor and configured to be electrically connectable to a corresponding pair of terminals on the battery tester.

10. The method of claim 9, wherein the step of receiving the user input signal includes receiving a desired cranking status at a cranking voltage input circuit in operative communication with the processor.

11. The method of claim 9, wherein the step of receiving the user input signal includes receiving a desired drop voltage at a drop voltage input circuit in operative communication with the processor.

12. The method of claim 9, further comprising the steps of:
detecting a battery tester load in response to the pair of testing terminals being electrically connected to the corresponding pair of terminals on the battery tester; and
generate a warning signal when the detected battery tester load is above a predetermined magnitude.

13. The method of claim 9, further comprising the step of receiving a start signal from the user at a start circuit in communication with the processor, the processor being configured to facilitate transmission of the testing signal via the pair of testing terminals in response to receipt of the start signal.

14. The method of claim 9, further comprising the step of displaying information associated with the testing signal on a display in communication with the processor.

15. A voltage signal simulator for use in testing operational capability of a battery tester, the simulator comprising:
a user interface configured to receive a user input signal corresponding to a desired battery health testing condition;
a processor in communication with the user interface and being configured to:
identify at least testing signal characteristic based on the desired battery health testing condition; and
facilitate generation of an electrical testing signal having the at least one testing signal characteristic having been identified;
a pair of testing terminals in operative communication with the processor and configured to be electrically connectable to a corresponding pair of terminals on the battery tester for communicating the testing signal to the battery tester.

16. The simulator of claim 15, wherein the user interface includes a cranking voltage input circuit configured to receive at least a portion of the user input signal corresponding to a desired cranking status.

17. The simulator of claim 16, wherein the user interface includes a drop voltage input circuit configured to receive at least a portion of the user input signal corresponding to a desired drop voltage.

18. The simulator of claim 15, wherein the processor is further configured to:
detect a battery tester load in response to the pair of testing terminals being electrically connected to the corresponding pair of terminals on the battery tester; and
generate a warning signal when the detected battery tester load is above a predetermined magnitude.

* * * * *